US012764933B2

(12) United States Patent
Gu et al.

(10) Patent No.: US 12,764,933 B2
(45) Date of Patent: Oct. 13, 2026

(54) DRAM TRANSISTOR INCLUDING PILLARS FORMED USING LOW-TEMPERATURE ION IMPLANT

(71) Applicant: Applied Materials, Inc., Santa Clara, CA (US)

(72) Inventors: Sipeng Gu, Clifton Park, NY (US); Qintao Zhang, Mt Kisco, NY (US)

(73) Assignee: Applied Materials, Inc., Santa Clara, CA (US)

( * ) Notice: Subject to any disclaimer, the term of this patent is extended or adjusted under 35 U.S.C. 154(b) by 647 days.

(21) Appl. No.: 18/100,289

(22) Filed: Jan. 23, 2023

(65) Prior Publication Data

US 2024/0251546 A1 Jul. 25, 2024

(51) Int. Cl.
*H10P 14/20* (2026.01)
*H10B 12/00* (2023.01)

(52) U.S. Cl.
CPC ......... *H10B 12/34* (2023.02); *H10B 12/0335* (2023.02); *H10B 12/0383* (2023.02); *H10B 12/0385* (2023.02); *H10B 12/053* (2023.02); *H10B 12/39* (2023.02); *H10B 12/395* (2023.02); *H10P 14/3822* (2026.01)

(58) Field of Classification Search
None
See application file for complete search history.

(56) References Cited

U.S. PATENT DOCUMENTS

| | | | | |
|---|---|---|---|---|
| 8,865,558 B2 * | 10/2014 | Park | H10N 70/041 438/785 |
| 2009/0163000 A1 * | 6/2009 | Cho | H10B 12/053 438/585 |
| 2010/0078698 A1 * | 4/2010 | Son | B82Y 10/00 257/329 |
| 2017/0069726 A1 * | 3/2017 | Kye | H10D 64/01 |
| 2020/0279944 A1 * | 9/2020 | Liu | H10D 30/0243 |
| 2021/0391330 A1 * | 12/2021 | Zhu | H10B 61/22 |
| 2022/0336469 A1 * | 10/2022 | Breil | H10B 12/485 |
| 2023/0207317 A1 * | 6/2023 | Bomberger | H10D 30/014 257/401 |

OTHER PUBLICATIONS

Cho et al., "Suppression of the Floating-Body Effect of Vertical-Cell DRAM With the Buried Body Engineering Method", IEEE Transactions on Electron Devices, vol. 65, No. 8, Aug. 2018, pp. 3237-3242.

(Continued)

*Primary Examiner* — William Henry Anderson
(74) *Attorney, Agent, or Firm* — KDW Firm PLLC

(57) ABSTRACT

Disclosed herein are approaches for forming a dynamic random-access memory device (DRAM). In one approach, a method may include forming a plurality of bridge layers in a substrate by directing first ions into the substrate while the substrate is at a low temperature, wherein the ions are directed into the substrate in a series of implants, and annealing the plurality of bridge layers. The method may further include forming a contact by directing second ions into an upper surface of the plurality of bridge layers while the substrate is at the low temperature, and forming a pillar over the contact.

14 Claims, 3 Drawing Sheets

(56) References Cited

OTHER PUBLICATIONS

Chung et al., “Novel 4F2 DRAM Cell with Vertical Pillar Transistor(VPT)”, 78-1-4577-0708-7/11, pp. 211-214.
Capogreco et al., “Integration and electrical evaluation of epitaxially grown Si and SiGe channels for vertical NAND Memory applications”, 4 pages.
Goebel et al., “Fully Depleted Surrounding Gate Transistor (SGT) for 70 nm DRAM and Beyond”, pp. 275-278.
Han et al., “Surround Gate Transistor With Epitaxially Grown Si Pillar and Simulation Study on Soft Error and Rowhammer Tolerance for DRAM”, pp. 529-534.
Yang et al., “Benefits of cryo-implantation for 28 nm NMOS advanced junction formation”, Online at stacks.iop.org/SST/27/045003, Semicond. Sci. Technol. 27 (2012) 045003 (4pp), doi:10.1088/0268-1242/27/4/045003, 6 pages.

* cited by examiner

DRAM TRANSISTOR INCLUDING PILLARS FORMED USING LOW-TEMPERATURE ION IMPLANT

FIELD OF THE DISCLOSURE

The present disclosure relates to semiconductor structures and, more particularly, to a dynamic random-access memory (DRAM) transistor including pillars formed using a low-temperature ion implant process.

BACKGROUND OF THE DISCLOSURE

As DRAM devices scale to smaller dimensions, an increasing emphasis is placed on patterning for forming three dimensional structures, including trenches for storage nodes as well as access transistors. In current DRAM devices, transistors may be formed using narrow and tall, vertical semiconductor fin structures, often made from monocrystalline silicon. In accordance with current trends, the aspect ratio of such fin structures, meaning the height (depth) of a fin divided by the spacing between adjacent fins, may reach 20:1 or more in the coming years.

In an effort to continue scaling smaller, $4F^2$ DRAM devices have been developed. However, current $4F^2$ DRAM devices suffer from high common bitline (BL) resistance and floating-body effect.

It is with respect to these and other drawbacks of the current art that the present disclosure is provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include forming a plurality of bridge layers in a substrate by directing first ions into the substrate while the substrate is at a low temperature, wherein the ions are directed into the substrate in a series of implants, and annealing the plurality of bridge layers. The method may further include forming a contact by directing second ions into an upper surface of the plurality of bridge layers while the substrate is at the low temperature, and forming a pillar over the contact.

In another aspect, a method of forming a dynamic random-access memory device may include forming a plurality of bridge layers in a substrate by directing first ions into the substrate while the substrate is at a low temperature, wherein the ions are directed into the substrate in a series of implants each performed at a different implant energy. The method may further include annealing the plurality of bridge layers, forming a contact by directing second ions into an upper surface of the plurality of bridge layers while the substrate is at the low temperature, and forming a pillar over the contact.

In yet another aspect, a DRAM transistor may include a plurality of bridge layers formed in a substrate, a contact formed in the plurality of bridge layers, and a pillar formed over the contact, wherein a gate surrounds the pillar.

BRIEF DESCRIPTION OF THE DRAWINGS

The accompanying drawings illustrate exemplary approaches of the disclosure, including the practical application of the principles thereof, as follows.

Figure 1:
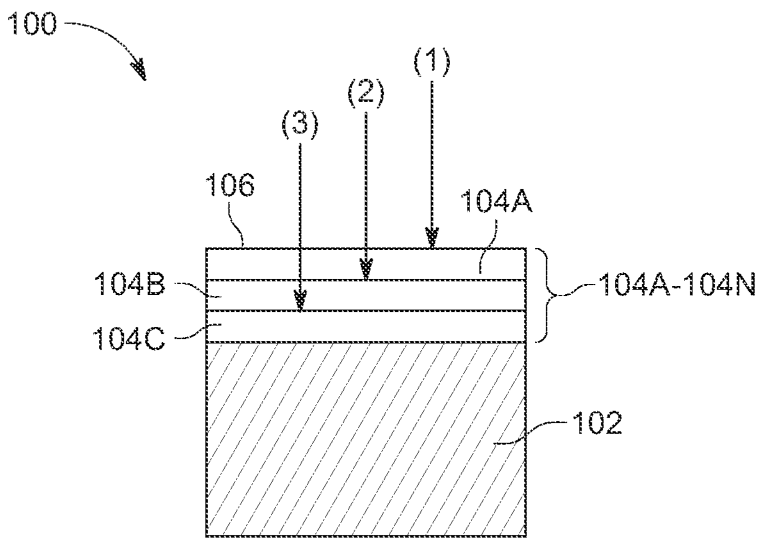
FIG. 1 illustrates a cross-sectional side view of a portion of a DRAM device during a low-temperature implantation process, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Devices, DRAM transistors, and methods in accordance with the present disclosure will now be described more fully hereinafter with reference to the accompanying drawings, where various embodiments are shown. The devices, DRAM transistors, and methods may be embodied in many different forms and are not to be construed as being limited to the embodiments set forth herein. Instead, these embodiments are provided so the disclosure will be thorough and complete, and will fully convey the scope of the methods to those skilled in the art.

To address the deficiencies of the prior art described above, disclosed herein are methods and devices (e.g., 4F2 vertical DRAM transistors) with pillars formed following a low-temperature ion implantation to a substrate (e.g., silicon substrate), which ensures less defects for high quality Epi-Si growth and addresses the floating body issue. Furthermore, low bitline (BL) resistance is possible with heavy doping at low-temperature, which enables a true 4F2 DRAM scheme (i.e., no need additional metal contact in the device.

FIG. 1 illustrates a cross-sectional side view of a portion of a DRAM device 100 (hereinafter "device") during a low-temperature implantation process, according to embodiments of the present disclosure. Low-temperature in the context of the present disclosure may mean temperatures between approximately 0 and −100° C. In some embodiments, the low-temperature implant may be performed at less than −100° C. The device 100 may include a substrate 102, and a plurality of bridge layers 104A-104N formed in an upper area of the substrate 102, wherein the substrate 102 and the plurality of bridge layers 104A-104N may be silicon.

The plurality of bridge layers 104A-104N may be formed by directing ions into the substrate 102 over a series of successive implants. For example, a first ion implant process (1) may be performed whereby ions (e.g., P+, As+, Sb+) are directed into an upper surface 106 of the substrate 102 at a first energy, such as 7 keV, 3E15 to, form first N+ bridge layer 104A. A second ion implant process (2), which may be performed following the first ion implant process, may include delivering ions at a second energy, such as 21 keV, 3E15, to form bridge layer 104B. A third ion implant process (3) may be performed following the second ion implant process, e.g., at an energy of 35 keV, 3E15, to form bridge layer 104C. The doping sequence is not critical, however, and may be reversed, for example. Embodiments of the disclosure are not limited to any particular number of implant processes and/or bridge layers. Although non-limiting, the implant angle may be perpendicular, or approximately perpendicular, to a plane defined by the top surface 106 of the substrate 102. The implantation angle may vary in other embodiments.

Each of the first, second, and third implant processes may be performed while the substrate 102 is at a low temperature. Said differently, the ions may be delivered as part of a cryogenic ion implant process, which is performed between 0 and −100 degrees C. In some embodiments, the cryogenic ion implant includes chilling a platen or substrate holder (not shown) upon which the substrate 102 is provided. The low-temperature ion implant enables higher-dose doping, which lowers defect levels and lowers contact and bridge layer resistance. Furthermore, the low-temperature implant provides a thicker pre-amorphizing implant (PAI), which leads to less end-of-range (EOR) defects.

Figure 2:
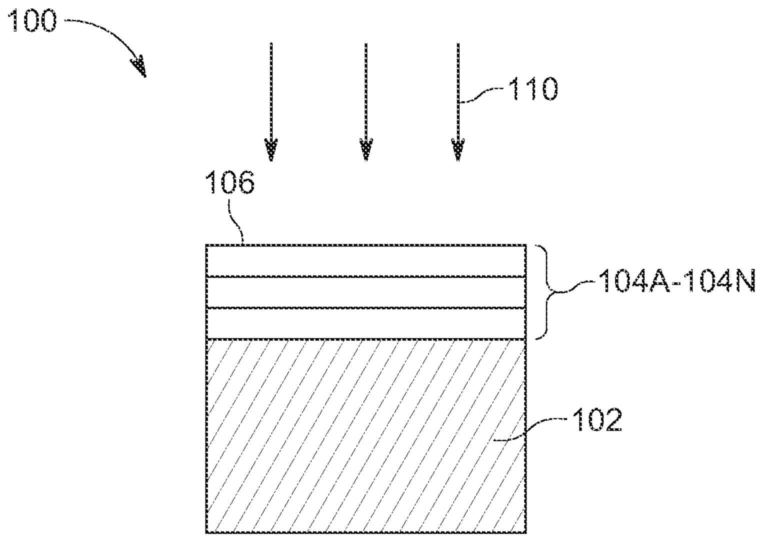
FIG. 2 illustrates a cross-sectional side view of a portion of the DRAM device during an annealing process, according to embodiments of the present disclosure.

Following the ion implants, the device 100 is annealed 110, as shown in FIG. 2, to reduce residue defects. In some embodiments, the anneal 110 is a thermal anneal performed at a temperature between 650 C and 950 C for a specific period of time (e.g., 60*s*) in inert N2 ambient at atmospheric pressure. The anneal temperature, time and ambient may be changed based on device requirements.

Figure 3:
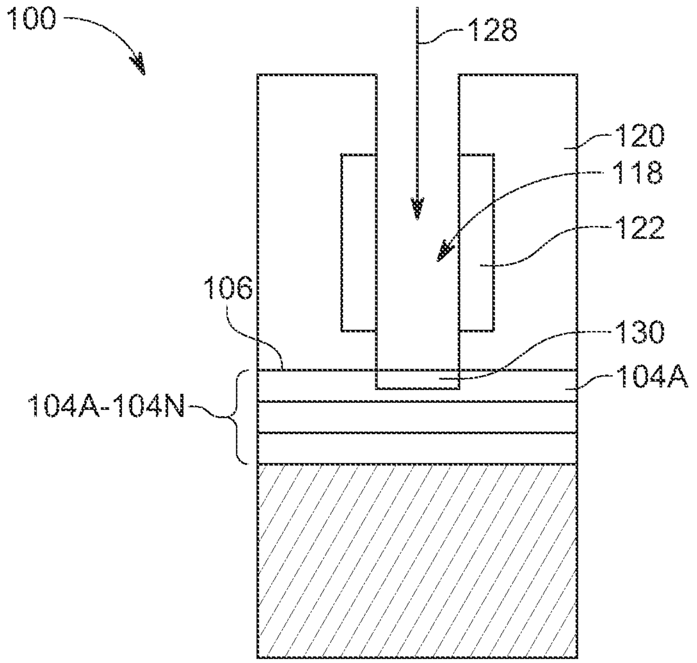
FIG. 3 illustrates a cross-sectional side view of a portion of the DRAM device during a second low-temperature implantation process, according to embodiments of the present disclosure.

As shown in FIG. 3, an opening 118 may be provided through a shallow trench isolation (STI) 120, the opening 118 extending to the upper surface 106 of the substrate 102. Although not specifically shown in detail, the device 100 may undergo active area patterning, deposition of the STI 120, an oxide/n+ poly/oxide deposition, wordline (WL) patterning, an oxide fill/CMP, and pillar hole patterning to form the opening 118. As shown, the opening 118 is surrounded by a gate 122. One non-limiting material for the STI 120 may include SiO2, which can be deposited using FCVD, HDP, a high-aspect ratio process (HARP), etc. One non-limiting material for the gate 122 may include P+ polysilicon, metal gate, etc.

Figure 4:
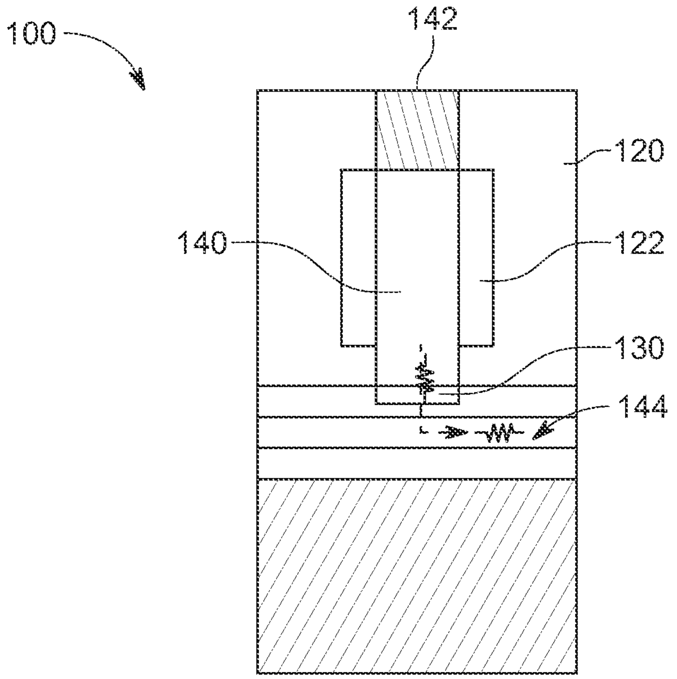
FIG. 4 illustrates a cross-sectional side view of a portion of the DRAM device following formation of a pillar, according to embodiments of the present disclosure.

With the upper surface 106 of the substrate 102 exposed, another low-temperature implantation process 128 may be performed to form a contact 130 in the plurality of bridge layers 104A-104N. More specifically, the contact 130 may be formed in bridge layer 104A by delivering ions (e.g., P+, As+, Sb+) into the upper surface 106 at a temperature between approximately 0 and −100° C. Although non-limiting, the ions may be delivered at an implant energy of approximately 7 keV, 5E15. In this case, no annealing step is performed following the low-temperature implantation process 128. Instead, a pillar 140 is then epitaxially grown within the opening 118, as demonstrated in FIG. 4. In some embodiments, the pillar 140 is a silicon pillar, which is formed directly over the contact 130. In some embodiments, the pillar is a SiGe, or mixture of Si and SiGe, or other III-V or II-VI materials. A doped storage node 142 may also be formed in the pillar 140, the doped storage node 142 being located above the gate 122. Unlike some prior art approaches, no metal contact is required to be present in the STI 120 adjacent the pillar 140 and gate 122, thus enabling a truer 4F2 DRAM due to the lower resistance of bitline 144.

Figure 5:
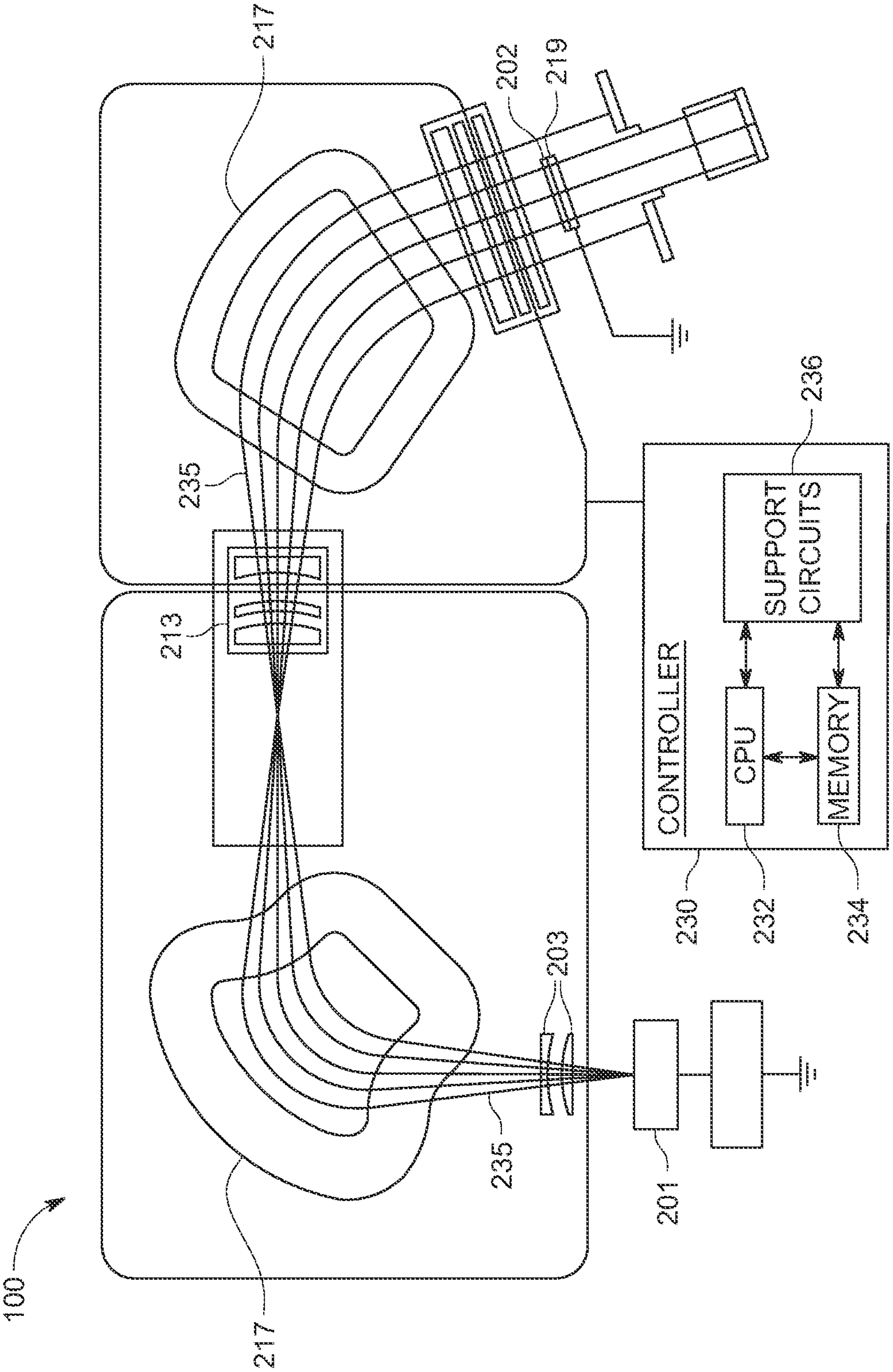
FIG. 5 illustrates a diagram of a processing apparatus according to embodiments of the present disclosure.

FIG. 5 illustrates a schematic diagram of a processing apparatus 200 useful to perform processes described herein. One example of a beam-line ion implantation processing apparatus is the Varian VIISTA® Trident, available from Applied Materials Inc., Santa Clara, CA. The processing apparatus 200 may include an ion source 201 for generating ions. For example, the ion source 201 may provide an ion implant, such as the low-temperature ion implant(s) demonstrated in FIG. 1 and FIG. 3.

The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the substrate 102 described above. The substrate 202 may be moved in one or more dimensions (e.g., translate, rotate, tilt, etc.) by a platform component sometimes referred to as a "roplat" (not shown). It is also contemplated that the platen 219 may be configured to perform the heated implantation processes described herein to modify one or more waveguide surfaces.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method of forming a device, comprising:

forming a plurality of bridge layers in a substrate by directing first ions into the substrate while the substrate is at a low temperature, wherein the first ions are directed into the substrate in a series of implants;

annealing the plurality of bridge layers;

forming a shallow trench isolation layer directly atop the plurality of bridge layers;

patterning an opening through the shallow trench isolation layer to expose an upper surface of the plurality of bridge layers;

forming a contact by directing second ions through the shallow trench isolation layer and into the upper surface of the plurality of bridge layers while the substrate is at the low temperature; and epitaxially forming a pillar directly over the contact.

2. The method of claim 1, wherein each implant of the series of implants is performed at a different implant energy.

3. The method of claim 1, further comprising forming a gate along the pillar.

4. The method of claim 3, further comprising forming a doped storage node in the pillar, wherein the doped storage node is located above the gate.

5. The method of claim 1, wherein no annealing process is performed between formation of the contact and formation of the pillar.

6. The method of claim 1, further comprising maintaining the substrate at a temperature less than 0° C. during the series of implants and during the formation of the contact.

7. The method of claim 1, wherein epitaxially forming the pillar comprises growing silicon from an upper surface of the contact.

8. The method of claim 1, further comprising forming the substrate and the plurality of bridge layers from silicon.

9. A method of forming a dynamic random-access memory device, comprising:

forming a plurality of bridge layers in a substrate by directing first ions into the substrate while the substrate is at a low temperature, wherein the first ions are directed into the substrate in a series of implants each performed at a different implant energy;

annealing the plurality of bridge layers;

forming a shallow trench isolation layer directly atop the plurality of bridge layers;

patterning an opening through the shallow trench isolation layer to expose an upper surface of the plurality of bridge layers;

forming a contact by directing second ions through the shallow trench isolation layer and into the upper surface of the plurality of bridge layers while the substrate is at the low temperature; and epitaxially forming a pillar directly over the contact.

10. The method of claim 9, further comprising forming a doped storage node in the pillar, wherein the doped storage node is located above a gate.

11. The method of claim 9, further comprising maintaining the substrate at a temperature between 0° C. and −100° C. during the series of implants and during the formation of the contact.

12. The method of claim 9, wherein epitaxially forming the pillar comprises growing silicon from an upper surface of the contact.

13. The method of claim 9, further comprising forming the substrate and the plurality of bridge layers from silicon.

14. A method of forming a device, comprising:

forming a plurality of bridge layers in a substrate by directing first ions into the substrate while the substrate is at a low temperature, wherein the first ions are directed into the substrate in a series of implants;

annealing the plurality of bridge layers;

patterning an opening through a shallow trench isolation layer to expose an upper surface of the plurality of bridge layers;

forming a contact by directing second ions through the shallow trench isolation layer and into the upper surface of the plurality of bridge layers while the substrate is at the low temperature; and forming a pillar over the contact, wherein no annealing process is performed between formation of the contact and formation of the pillar.

* * * * *